United States Patent [19]
Bosch
[11] 3,766,444
[45] Oct. 16, 1973

[54] SEMICONDUCTOR DEVICE HAVING AN INTEGRATED THERMOCOUPLE

[75] Inventor: Gerrit Bosch, Emmasingel, Eindhoven, Netherlands

[73] Assignee: U.S. Philips Corporation, New York, N.Y.

[22] Filed: Aug. 23, 1972

[21] Appl. No.: 283,214

[30] Foreign Application Priority Data

Aug. 25, 1971 Netherlands .......................... 7111653

[52] U.S. Cl........... 317/234 R, 317/235 Q, 307/310, 219/405

[51] Int. Cl.............................. H01l 3/00, H01l 5/00

[58] Field of Search........................ 317/235, 29, 29.1; 307/310; 219/405

[56] References Cited

UNITED STATES PATENTS

| | | | |
|---|---|---|---|
| 3,258,606 | 6/1966 | Meadows | 317/235 Q |
| 3,321,716 | 5/1967 | Lyon-Caen | 317/235 Q |
| 3,393,328 | 7/1968 | Meadows et al. | 317/235 |
| 3,395,265 | 7/1968 | Weir | 317/235 |
| 3,462,317 | 8/1969 | Baum et al. | 317/235 Q |
| 3,566,690 | 3/1971 | Ebrahimi | 317/235 Q |
| 3,667,064 | 5/1972 | Thornton et al. | 307/310 |

*Primary Examiner*—John W. Huckert
*Assistant Examiner*—Andrew J. James
*Attorney*—Frank R. Trifari

[57] ABSTRACT

A semiconductor device, in particular a monolithic integrated circuit, having at least a heat-dissipating element and at least a temperature-sensitive element. According to the invention the temperature-sensitive element is a thermocouple. Application in particular in a fully integrated thermal oscillator in which the thermocouple signal is fed back in an amplified manner to a bistable heat dissipating element which as a result of this is switched to the other stable condition.

10 Claims, 4 Drawing Figures

SEMICONDUCTOR DEVICE HAVING AN INTEGRATED THERMOCOUPLE

Figure 1:
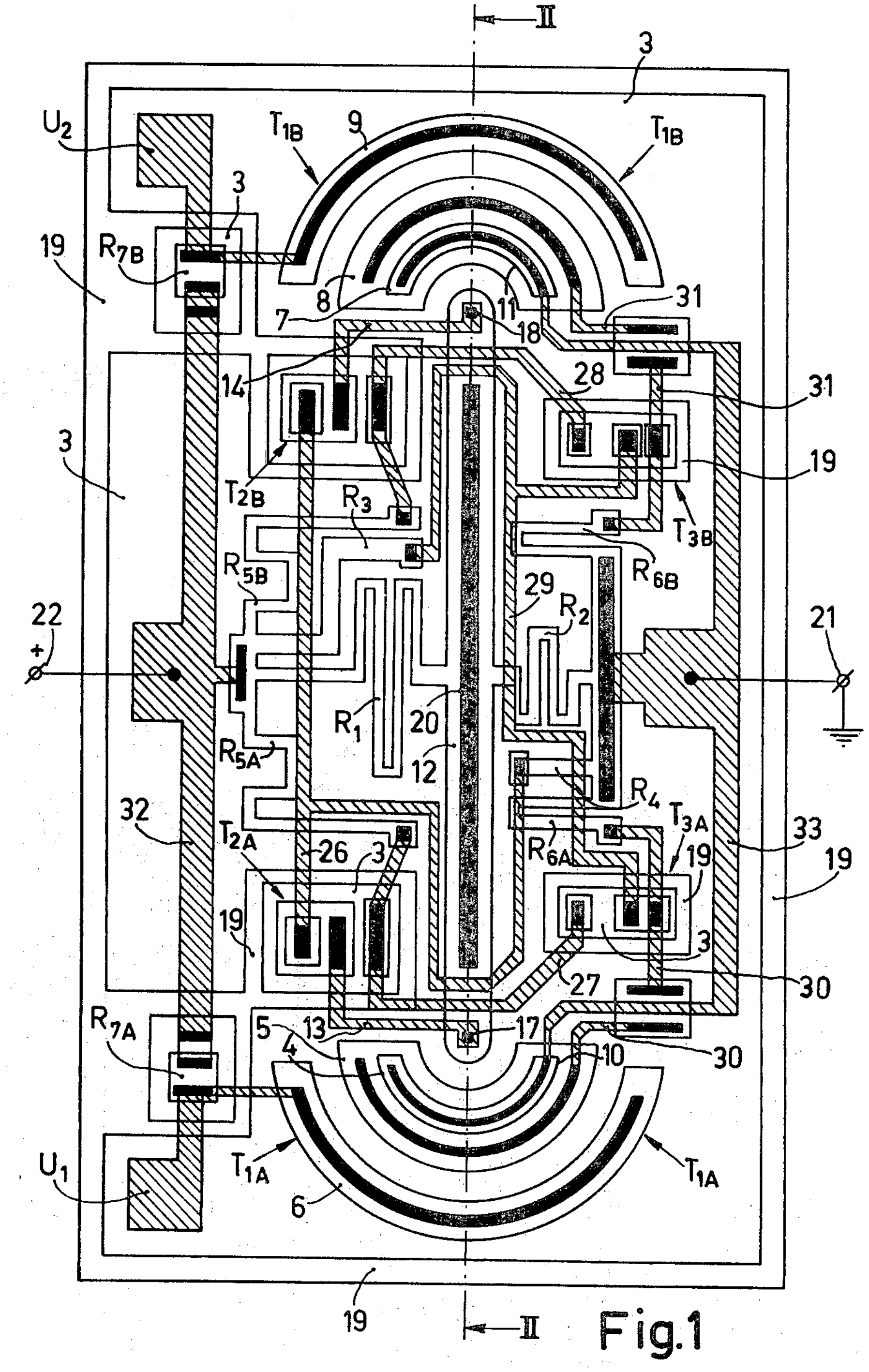

The invention relates to a semiconductor device having a semiconductor body comprising at least a semiconductor circuit element and a temperature-sensitive element provided at least partly in the semiconductor body for converting a part of the thermal energy developed in the operating condition by the said semiconductor circuit element into an electric signal.

It is known in a semiconductor device to measure the temperature which prevails in a given place of the semiconductor body as a result of the heat dissipation by a semiconductor circuit element present in the vicinity, by means of a temperature-sensitive element integrated entirely or partly in the semiconductor body. As temperature-sensitive elements are used in the known devices temperature-sensitive resistors, for example, as described in German Auslegeschrift No. 1,275,110, or elements having p-n junctions, for example, diodes and transistors, see, for example, the U. S. Pat. specification No. 3,393,328, in which latter case the current across one or more of the said p-n junctions varies with the temperature.

For various reasons it is very desirable in many cases that the temperature-sensitive element be as small as possible and preferably substantially punctiform as compared with the heat-generating circuit element. As a result of this an accurately localized temperature measurement can be obtained in the first place. Of even grater importance, however, is a substantially punctiform temperature-sensitive element in those devices in which the electric signal derived from the temperature-sensitive element is used to form an oscillator or a filter by feedback coupling to the heat-reducing element, the frequency of the oscillator and the frequency band of the filter, respectively, being determined by the distance of the heat-generating circuit element or the temperature-sensitive element, which distance must be very small to reach high frequencies. For the devices operating according to this principle it is of essential importance that the distance from the temperature-sensitive element to the heat-generating part of the circuit element be accurately defined and substantially equal in all directions. This can be realised only if either the heat source, or the temperature-sensitive element, or both, are substantially punctiform.

The temperature-sensitive resistors, diodes or transistors used in known devices have in general a comparatively large surface. As a result of this a very local temperature measurement is not possible with these elements, while in addition the distance from the temperature-sensitive element to the region where thermal energy is generated is not unambiguously determined.

As a result of this, for example, known thermal oscillators manufactured with the use of said temperature-sensitive elements generally have a very low frequency (0.1 – 10 Hz) which is not determined by the phase difference of the temperature wave between heat source and temperature-sensitive element over an accurately defined distance, since in such a device the distance between a point of the heat source and a point of the temperature-sensitive element varies considerably. The effective distance hence is many times larger than the smallest distance.

In practice, however, there often exists a need for oscillators having a frequency between 10 and $10^6$ Hz. This frequency range is too high for known thermal oscillators, while non-thermal oscillators in this frequency range are difficult to manufacture or cannot at all be manufactured in a fully integrated form, inter alia since the capacitances and/or resistors required therefor are too large.

One of the objects of the invention is to remove or at least considerably reduce the said drawbacks occurring in known devices, as a result of which in particular thermal oscillators or filters having a frequency between 10 and $10^6$ Hz can be constructed in a fully integrated form. For that purpose the invention is inter alia based on the recognition of the fact that by using a heat-dissipating circuit element in combination with an integrated temperature-sensitive element which uses the thermoelectric effect (Seebeck-effect) a very local temperature measurement can be carried out as a result of which inter alia thermal oscillators for frequencies up to more than 200 kHz ($2.10^5$ $sec^{-1}$) can be manufactured.

A semiconductor device of the type described in the preamble is therefore characterized according to the invention in that the temperature-sensitive element is a thermocouple comprising at least two electric conductors which constitute at least one temperature-sensitive junction present in the proximity of the semiconductor circuit element.

By a combination of a heat supplying semi-conductor circuit element and a thermocouple according to the invention integrated therewith, a very localized temperature measurement is possible since the thermocouple need have only a very small temperature-sensitive junction. This also permits in an integrated circuit of a large packing density. In connection herewith, according to an important preferred embodiment, the surface area of the temperature-sensitive junction is very small relative to the dimensions of the heat supplying part of the circuit element.

As already noted above it is desirable in many cases that the temperature waves emitted by all points of the heat source should arrive at the temperature-sensitive junction in phase. It is therefore desirable in general, that the distance between the heat source and the temperature-sensitive junction be accurately defined and notably, taken from the temperature-sensitive junction, be equal in all directions. Therefore, any point of the heat supplying part of the semiconductor circuit element is preferably present at substantially the same distance from the temperature-sensitive junction, for example, in a spherical surface or a thin spherical layer with the temperature-sensitive junction as centre. An important preferred embodiment is characterized in that the heat supplying part of the semiconductor circuit element is in the form of a strip which is bounded by concentric arcs of circles with the temperature-sensitive junction as centre, said strip being narrow relative to its distance to the temperature-sensitive junction.

Of particular interest in the invention in those cases in which the heat supplying circuit element is an element which supplies thermal energy in a first stable condition, termed the conductive condition, and supplies substantially no thermal energy in a second stable condition, termed the non-conductive condition, the electric signal originating from the temperature-sensitive element, whether amplified or not, being used by feedback coupling to switch the element from the first stable condition into the second stable condition. For example, the element may inter alia be a transistor, a thyristor or a double-base diode. In connection herewith, an important preferred embodiment is characterized in that the circuit element is an element having a conductive and a non-conductive condition and supplying thermal energy in the conductive condition, and that the output of the thermocouple is connected, via a feedback circuit, to the input of the said element so that the electric signal originating from the thermocouple switches the element from one stable condition to the other.

In this case the device according to the invention is advantageously constructed to be substantially symmetrical in such manner that the semiconductor body comprises a flipflop circuit having at least a first and a second transistor of which in the operating condition only the first or only the second transistor is conductive, that the thermocouple comprises a first temperature-sensitive junction near the emitter-base junction of the first transistor and a second temperature-sensitive junction near the emitter-base junction of the second transistor, and that the signal originating from the thermocouple is supplied, via an amplifier circuit integrated in the body, to the base of the said first and second transistors, as a result of which said transistors are switched to another stable condition.

At least a conductor of the thermocouple is preferably constituted by a strip-shaped surface zone of the semiconductor body. A very suitable construction is characterized in that the thermocouple comprises a strip-shaped surface zone of the semiconductor body on at least one and on preferably both ends of which a metal layer adjoins which forms a temperature-sensitive junction with the surface zone. The said zone preferably is of silicon, while the metal layers consist of aluminium which may also serve for contacting other parts of the circuit. However, the temperature-sensitive junctions may also be formed between an n-type and a p-type semiconductor zone, the formed p-n junction having to be short-circuited electrically. Another preferred embodiment according to the invention is therefore characterized in that the thermocouple comprises a strip-shaped surface zone of a first conductivity type in which locally at least a zone of the second conductivity type is provided which forms a p-n junction with the strip-shaped surface zone, said junction being short-circuited at the surface by a metal layer.

In order to reduce the noise which is caused in the comparatively large resistor which is formed by the said surface zone, it is desirable that the strip-shaped surface zone outside the temperature-sensitive contacts junctions be covered for a considerable part with a readily conducting layer which short-circuits the underlying part of the surface zone electrically. The readily conducting layer, preferably a metal layer, advantageously covers all parts of the surface zone in which substantially no temperature gradient prevails.

Figure 2:
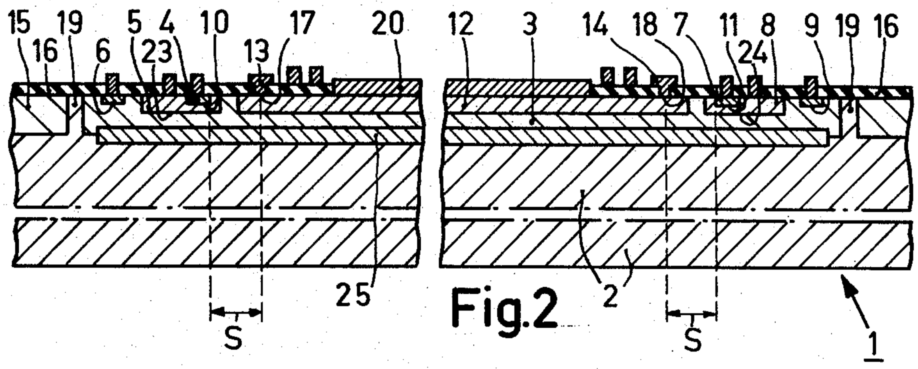
Figure 3:
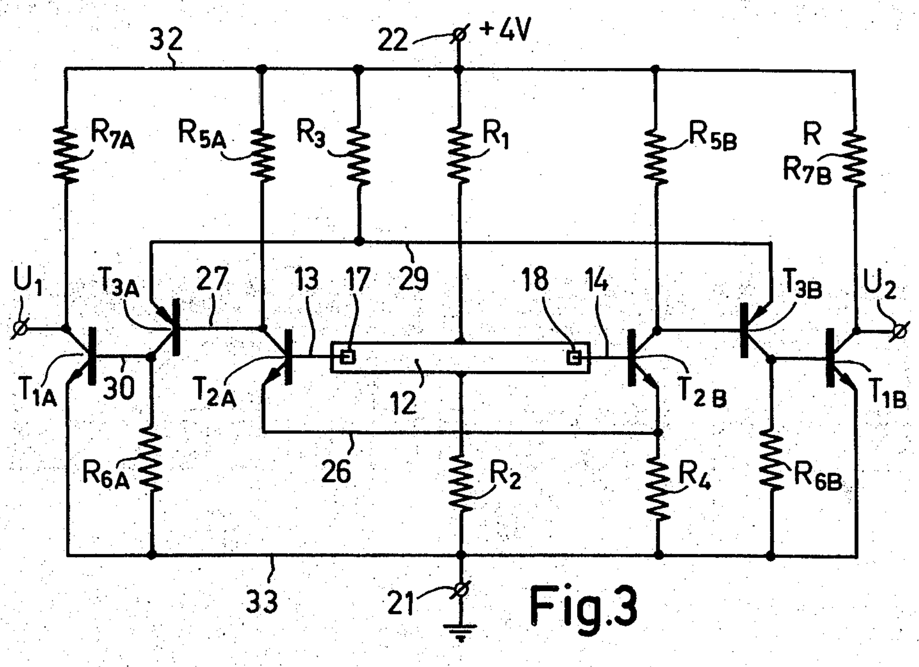
Figure 4:
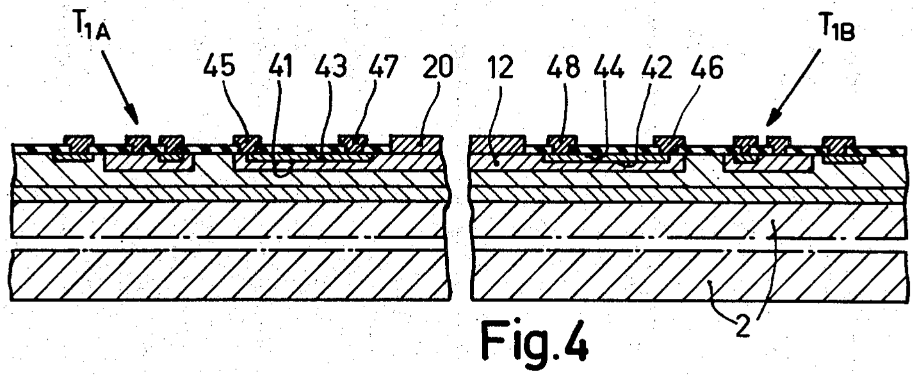

The invention will now be described in greater detail with reference to an embodiment and the drawing, in which FIG. 1 is a diagrammatic plan view of the semiconductor device according to the invention FIG. 2 is a diagrammatic cross-sectional view of the device shown in FIG. 1 taken on the line II—II of FIG. 1, and FIG. 3 shows diagrammatically the circuit diagram of the device shown in FIGS. 1 and 2, and FIG. 4 is a diagrammatic cross-sectional view of another embodiment of a device according to the invention.

The figures are diagrammatic and not drawn to scale; this applies in particular to the thickness dimensions in FIG. 2. In FIG. 1 the contact windows are shadowed and the metallisation is denoted by an oblique shading. In FIG. 2, semiconductor regions of the same conductivity type are shaded in the same direction. Corresponding parts in the figures are referred to by the same reference numerals.

FIG. 1 is a diagrammatic plan view and FIG. 2 a diagrammatic cross-sectional view(taken on the line II—II of FIG. 1) of a device according to the invention. The device comprises a semi-conductor body 1 of silicon consisting of a p-type substrate 2 (resistivity 5 Ohm.cm) with a 10 microns thick n-type layer 3 grown thereon epitaxially (resistivity 0.6 Ohm.cm) in which the various semiconductor circuit elements are provided. The device comprises a first transistor $T_{1A}$ and a second transistor $T_{1B}$ quite identical thereto, which two transistors are incorporated in a flip-flop circuit (see FIG. 3) in which in the operating condition always either the transistor $T_{1A}$ or the transistor $T_{1B}$ is conductive. In the conductive condition thermal energy is evolved mainly in the parts of their collector-base junction present below the emitter-base junction (10, 11) of said transistors. The transistor $T_{1A}$ has an n-type emitter zone 4, a p-type base zone 5 and an n-type collector contact zone 6; the transistor $T_{1B}$ has an n-type emitter zone 7, a p-type base zone 8 and an n-type collector contact zone 9.

The device furthermore comprises a temperature-sensitive element which is partly provided in the semiconductor body. According to the invention, this element is a thermocouple which is formed by a conductor in the form of a strip-like p-type surface zone 12, and two conductors in the form of aluminium layers 13 and 14 which, via windows in a silicon oxide layer 17 present on the semiconductor surface 15, each contact the surface zone 12 and form therewith a first and a second temperature-sensitive junction 17 and 18. By said junctions 17 and 18, a part of the thermal energy evolved by the transistors $T_{1A}$ and $T_{1B}$ is converted into an electric signal which in this example is derived between the metal layers 13 and 14, as will be described in detail hereinafter. The sensitivity of this thermocouple is approximately 1.5 mV/°C.

The surface area of the temperature-sensitive junctions 17 and 18 ($5 \times 5$ $\mu$m ) is very small relative to the dimensions of the heat-producing parts, that is to say, the regions 23, 24 of the collector-base junctions of the transistors $T_{1A}$ and $T_{1B}$ present below the emitter-base junctions 10 and 11. As a result of this, an accurately localized temperature measurement can be obtained.

The first temperature-sensitive junction 17 is present near the emitter-base junction 10 of the first transistor $T_{1A}$, the second temperature-sensitive junction 18 is present near the emitter-base junction 11 of the second transistor $T_{1B}$. Any point of the heat supplying part (the part of the collector junction present below the emitter-base junction) of each of the transistors is present at substantially the same distance (in this example on an average 22.5 microns) from the associated temperature-sensitive junction. In the present example this has been achieved by giving the emitter-base junctions (10, 11) the shape of strips which are bounded by concentric arcs of circles with the associated substantially punctiform temperature-sensitive junction (17, 18) as centre, see FIG. 1, in which said strips, 10 microns wide, are narrow as compared with their distance to the temperature-sensitive junction.

The symmetrically constructed circuit which is shown diagrammatically in FIG. 3 comprises, in addition to the n-p-n transistors $T_{1A}$ and $T_{1B}$, the mutually identical n-p-n transistors $T_{2A}$ and $T_{2B}$, and the mutually identical p-n-p transistors $T_{3A}$ and $T_{3B}$, as well as the following diffused resistors:

$R_1$ value 14 kOhm
$R_2$ value 6 kOhm
$R_3$ value 2.2 kOhm
$R_4$ value 1 kOhm
$R_{5A,B}$ value 6 kOhm
$R_{6A,B}$ value 3 kOhm
$R_{7A,B}$ value 0.1 kOhm, which are diffused in the semiconductor body in a manner conventionally used in semiconductor technology and, together with the transistors $T_{1A}$ to $T_{3B}$ form a monolithic integrated circuit. The various elements are connected together by means of aluminium conductors 26 to 33 and insulated from each other in the conventional manner inside the body by a p-type separation diffusion 19 (FIGS. 1 and 2). A highly doped n-type buried layer (25, FIG. 2) is present below all transistors.

The operation of the device is as follows. As is apparent from FIGS. 1 and 3, the electric signal at the connections 13 and 14 originating from the thermocouple (12, 13, 14) is supplied to the bases of the transistors $T_{1A}$ and $T_{1B}$ via a feedback and amplifier circuit constituted by the resistors $R_1$ to $R_{6B}$ and the transistors $T_{2A}$ to $T_{3B}$. The connection terminal 21 is connected to earth, the connection terminal 22 is connected to a positive potential of +4 Volt.

When in the initial condition the transistor $T_{1A}$ is conductive and hence transistor $T_{1B}$ is non-conductive, the temperature wave transmitted by its collector-base junction is detected by the thermocouple the temperature-sensitive junction 17 of which obtains a higher temperature than the junction 18. By the fedback and amplified signal at the connection leads 13 and 14, $T_{1A}$ is switched from the conductive to the non-conductive condition, as a result of which $T_{1B}$ automatically obtains the conductive condition. The same process now occurs in which the signal of the thermocouple reverses its sign and the transistors $T_{1A}$ and $T_{1B}$ again return to the initial condition. In this manner an oscillator is obtained the output signal of which can be derived either between the output terminals 22 and $U_1$ across the resistor $R_{7A}$, or between the output terminals 22 and $U_2$ across the resistor $R_{7B}$.

The frequency of the oscillator described is determined by the distance *s* (see FIG. 2) between the heat-producing part (23, 24) of the collector-base junction of the transistors $T_{1A}$ and $T_{1B}$, and by the diffusion of the temperature waves through the semiconductor material. The frequency $f_o$ will adjust so that the phase difference of the temperature wave between the heat producing region and the associated temperature-sensitive junction is equal to $\pi$ radians. In the oscillator of the described example the frequency was 235 kHz.

In order to minimize the noise across the resistor constituted by the strip-like surface zones 12, said resistor is substantially short-circuited electrically by an aluminium layer 20 which covers substantially the whole region of the zone 12 outside the temperature-sensitive junctions, across which region substantially no temperature gradient occurs.

An important variation of the device according to the invention is obtained by using temperature-sensitive junctions between n-type and p-type silicon. FIG. 4 is a diagrammatic cross-sectional view of a thermocouple having such temperature-sensitive junctions. Instead of the metal-semiconductor junctions 17 and 18 (FIG. 2) junctions (41, 42) between the p-type zone 12 and the n-type zones (43, 44) are used in this case, the junctions 41 and 42 being short-circuited by metal layers 45 and 46. The parts of the junctions 41 and 42 nearest to the transistors $T_{1A}$ and $T_{1B}$ operate as temperature-sensitive junctions of said thermo-couple and these junctions between n-type and p-type material are more sensitive than those between a metal and p-type or n-type material. Attension should be paid to the fact that the connections 47 and 48 are provided as far as possible from the transistors $T_{1A}$ and $T_{1B}$, since otherwise the metal-semiconductor junctions formed thereby, which are also temperature-sensitive, also contribute to the signal.

It will be obvious that the invention is not restricted to the example described but that many variations and application possibilities exist to those skilled in the art without departing from the scope of this invention. For example, in the example described the feedback and amplifier circuit with the resistors $R_{7A}$ and $R_{7B}$ may be provided as an external circuit outside the semiconductor body, although preferably the whole circuit will be integrated. Essential is only, however, that the transistor $T_{1A}$ and $T_{1B}$ form one monolithic unit with the thermocouple.

Alternatively, an integrated thermocouple in a monolithic integrated circuit may be used, besides for forming an oscillator, also for other purposes, for example, for measuring temperature differences between various parts of the circuit and, via feedback coupling of the thermocouple signal, for eliminating such differences (differential thermostat). Furthermore, an oscillator may also consist only of one bistable element which is switched alternately in the conducting and non-conducting condition by feedback coupling of the thermocouple signal. Heat generating circuit elements other than transistors, for example, thyristors, resistors, diodes, etc., may also be used. Instead of an oscillator, the device may also form a filter, while a wide choice is available for those skilled in the art with respect to the geometry and materials used.

I claim:

1. A semiconductor device comprising:

a. a semiconductor body;

b. at least a thermal energy generating semiconductor circuit element located in said body;

c. means for converting a part of the thermal energy generated by said circuit element into an electrical signal, said means comprising a thermocouple comprising at least two electrical conductors of which at least one is disposed in said semiconductor body, said conductors comprising a substantially punctiform temperature-sensitive junction located proximate to said circuit element.

2. A semiconductor device as recited in claim 1, wherein said temperature-sensitive junction is relatively smaller than thermal energy-generating portions of said circuit element.

3. A semiconductor device as recited in claim 2, wherein all parts of said thermal energy-generating portions are substantially equidistant from said temperature sensitive junction.

4. A semiconductor device as recited in claim 3, wherein said thermal energy-generating portions define a strip having a substantially arcuate configuration and said temperature-sensitive junction is disposed at substantially the center of a circle comprising said arcuate strip, said strip having a width dimension smaller than the distance between said strip and said temperature-sensitive junction.

5. A semiconductor device as recited in claim 1, wherein said circuit element is characterized by having conductive and non-conductive conditions, said element generating thermal energy while it is in said conductive condition, said device further comprising a feedback circuit interconnecting the output of said thermocouple and the electrical input of said circuit element such that an electrical signal from said output switches said circuit element from one of said conditions to the other of said conditions.

6. A semiconductor device as recited in claim 5, wherein said body comprises a flip-flop circuit comprising at least a first and second transistors, only one of said transistors being electrically conductive at a certain time, said transistors individually comprising emitter, base, and collector zones, said thermocouple comprising first and second temperature-sensitive junctions respectively located proximate to the emitter-base junctions of said first and second transistors, said device further comprising an amplifier circuit integrated into said semiconductor body, said amplifier circuit electrically connecting said thermocouple and respective said base zones of said transistors, whereby an electrical signal from said thermocouple is supplied to said base zones via said amplifier circuit so that said transistors can be switched.

7. A device as recited in claim 1, wherein at least one of said thermocouple conductors comprises a surface zone of said semiconductor body having a strip configuration.

8. A device as recited in claim 7, further comprising a metal layer disposed on at least one end of said surface zone, said metal layer and said surface zone comprising a temperature-sensitive junction.

9. A device as recited in claim 7, wherein said thermocouple comprises a strip-shaped surface zone of said semiconductor body, said surface zone having a first conductivity type and comprising a further zone of a second opposite conductivity type, said surface and further zones forming a p,n junction said device further comprising a metal layer short circuiting said p,n junction.

10. A device as recited in claim 7, wherein a portion of said surface zone is removed from said temperature-sensitive junctions, said device further comprising an electrically conducting layer covering and electrically contacting said surface zone portion so as to short circuit said surface zone portion.

* * * * *